United States Patent [19]

Park et al.

[11] Patent Number: 5,089,741
[45] Date of Patent: Feb. 18, 1992

[54] PIEZOFILM IMPACT DETECTOR WITH PYRO EFFECT ELIMINATION

[75] Inventors: Kyung T. Park, Berwyn; R. Fredrick Gastgeb, Doylestown; Gregory Daniels, Chester, all of Pa.

[73] Assignee: Atochem North America, Inc., Philadelphia, Pa.

[21] Appl. No.: 555,245

[22] Filed: Jul. 19, 1990

[51] Int. Cl.$^5$ .................................. H01L 41/08
[52] U.S. Cl. ...................... 310/332; 310/315; 310/318; 310/358; 310/359; 310/800
[58] Field of Search ............... 310/800, 332, 315, 318, 310/358, 359, 339

[56] References Cited

U.S. PATENT DOCUMENTS

| | | | |
|---|---|---|---|
| 3,582,691 | 6/1971 | Neftenbach et al. | 310/8.4 |
| 3,593,048 | 7/1971 | Dunegan et al. | 310/319 |
| 3,673,443 | 6/1972 | Siegel | 310/8.7 |
| 3,828,210 | 8/1974 | Livenick et al. | 310/9.1 |
| 3,842,276 | 10/1974 | Southgate | 250/336 |
| 3,877,308 | 4/1975 | Taylor | 73/362 |
| 3,896,311 | 7/1975 | Taylor et al. | 250/342 |
| 3,916,348 | 10/1975 | Toda et al. | 333/33 |
| 3,971,250 | 7/1976 | Taylor | 310/800 |
| 3,999,069 | 12/1976 | Taylor et al. | 250/338 |
| 4,047,060 | 9/1977 | Schafft | 310/322 |
| 4,092,862 | 6/1978 | Taylor | 73/362 |
| 4,194,194 | 3/1980 | Redfern | 340/566 |
| 4,317,059 | 2/1982 | Besson | 310/361 |
| 4,383,194 | 5/1983 | Ohigashi et al. | 310/800 |
| 4,404,468 | 9/1983 | Kleinschmidt | 250/342 |
| 4,493,563 | 1/1985 | Peuzin | 374/121 |
| 4,531,267 | 7/1985 | Royer | 310/324 |
| 4,547,691 | 10/1985 | Valdois et al. | 310/361 |
| 4,570,098 | 2/1986 | Tomita et al. | 310/346 |
| 4,695,988 | 9/1987 | Banno | 367/154 |
| 4,706,069 | 11/1987 | Tom et al. | 310/800 |
| 4,739,211 | 4/1988 | Strachan | 310/321 |
| 4,823,802 | 4/1989 | Romanovskaya | 310/340 |
| 4,833,659 | 5/1989 | Geil et al. | 310/800 |
| 4,841,494 | 6/1989 | Banno | 310/800 |
| 4,868,447 | 9/1989 | Lee et al. | 310/366 |
| 4,939,407 | 7/1990 | Goo et al. | 310/366 |

FOREIGN PATENT DOCUMENTS

| | | | |
|---|---|---|---|
| 1108275 | 6/1961 | Fed. Rep. of Germany | 310/332 |
| 2915019 | 10/1979 | Fed. Rep. of Germany | 310/358 |
| 0079270 | 4/1986 | Japan | 310/332 |
| 2021864A | 5/1978 | United Kingdom . | |

OTHER PUBLICATIONS

Pennwalt Corp., Kynar Piezo Film, Technical Manual, 1987, pp. 1-65.
Pennwalt Corp., Kynar Piezo Film, Product Summary and Price List, 1988, pp. 1-8.

Primary Examiner—Steven L. Stephan
Assistant Examiner—Thomas M. Dougherty
Attorney, Agent, or Firm—Woodcock Washburn Kurtz Mackiewicz & Norris

[57] ABSTRACT

A structure for a piezo film impact detector eliminates or minimizes false outputs due to pyroelectric effects. The detector structure has particular application to outdoor and underground use.

62 Claims, 7 Drawing Sheets

FIG. 9
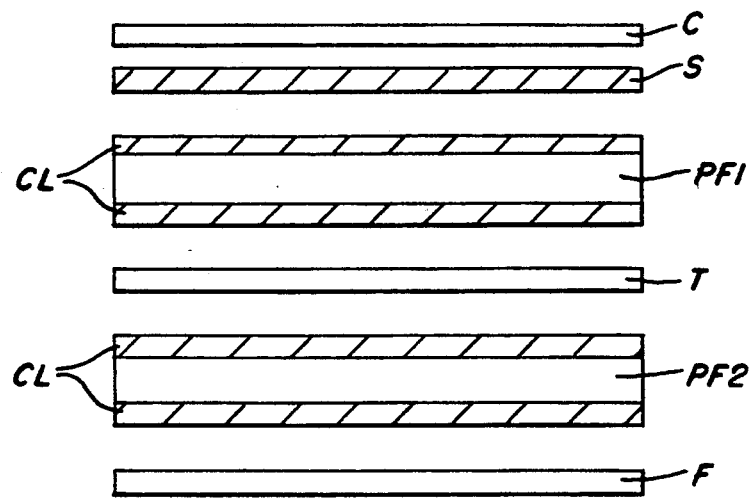
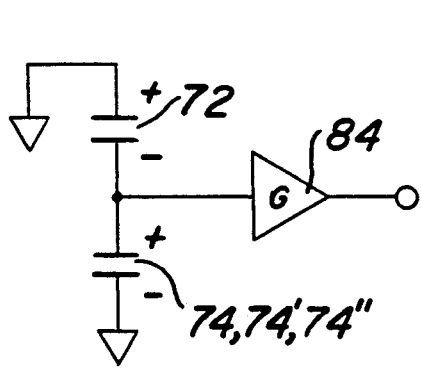
FIG. 10
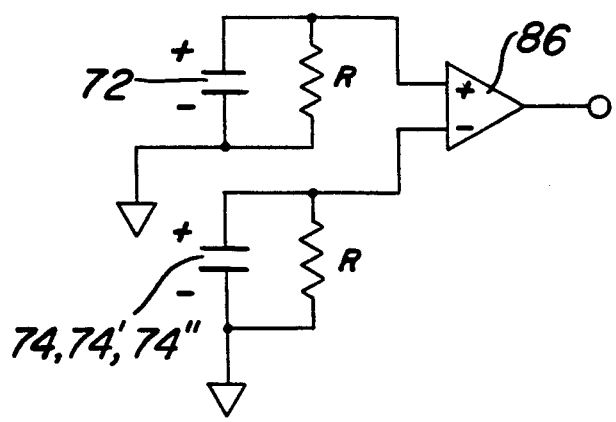
FIG. 11

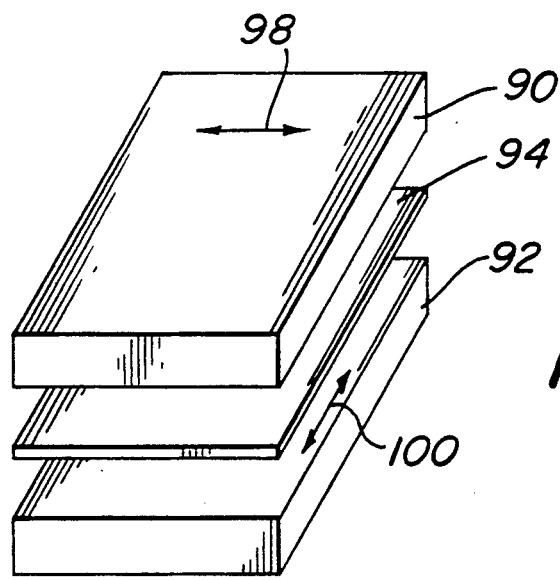
FIG. 12A
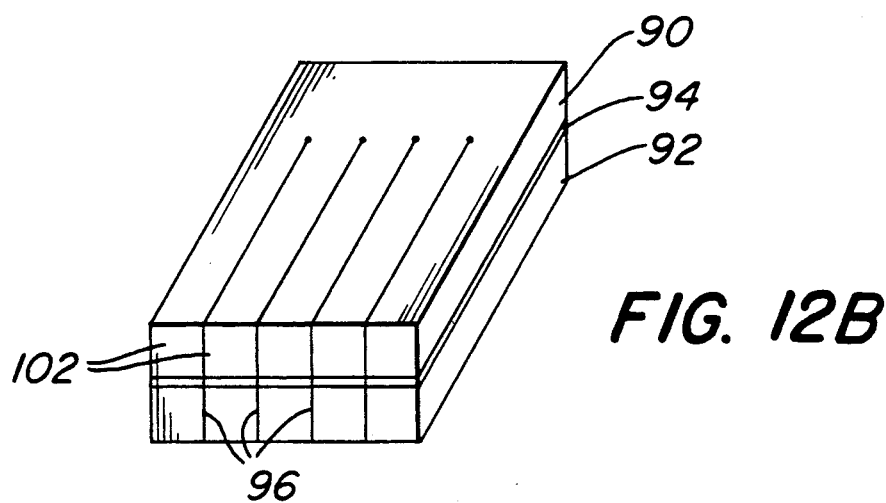
FIG. 12B
FIG. 12C

PIEZOFILM IMPACT DETECTOR WITH PYRO EFFECT ELIMINATION

FIELD OF THE INVENTION

The present invention relates generally to impact detectors. More particularly, the present invention relates to an arrangement employing piezoelectric film for simultaneously detecting impact forces while minimizing or eliminating pyro effects.

BACKGROUND OF THE INVENTION

Impact detectors are well known. They are generally employed in commercial and industrial applications to provide some indication (change of resistance, switch closure, output voltage or current) of the presence or passage of a person or vehicle to, for example, open a door or gate, sound an alarm, etc. They are also commonly employed in residential, commercial and industrial applications for intrusion detection.

Piezoelectric films ("piezo films") are well known to have application to impact detection. One significant benefit of piezo film is its dynamic property, i.e., it spontaneously generates a voltage (charge) pulse or transient upon impact, and therefore is useful as an impact detector that does not require voltage input or elaborate interface circuitry. Moreover, piezo films are inexpensive and impact detectors that employ piezo film are relatively simple.

One area where impact detectors have found use is in outdoor applications. For example, impact detectors are commonly embedded in roadways, e.g., near intersections, to signal the presence of a vehicle to a so-called "actuated" (as opposed to "pre-timed") traffic signal controller. Other potential outdoor applications for impact detectors include embedded mats in a parking lot for vehicle detection or in a yard area for intrusion detection.

It would be desirable to employ piezo film mats for these outdoor applications, but it is well known that piezo film exhibits another phenomenon that, heretofore, has rendered it unsuitable for outdoor impact detection applications. Piezo film also produces a voltage (charge) output when the temperature of the film (due to, e.g., sun light or environmental temperature) changes rapidly. The output from the film due to pyro effects is often indistinguishable from the output due to impact. For example, FIG. 1 shows piezo film output due to sunlight (simulated by an array of 300 watt infrared lamps) and FIG. 2 shows a foot step output on a piezo film mat. Of course, if piezo film is to be used for outdoor applications, and particularly in areas exposed to sunlight, then elimination or minimization of the pyro effect is crucial.

When moderate changes in temperature occur, the output due to the pyro effect is predominantly low frequency. In this case, a high pass filter can be employed to eliminate the pyro effect. In many outdoor applications, however, the frequency range of the pyro effect output is higher or identical to that of the impact output, and therefore this method cannot be employed.

It is therefore desirable to provide means, such as, but not necessarily limited to, a piezo film structure, that eliminates or minimizes the pyro effect of piezo film so that piezo film mats may be employed in outdoor applications. Such means should be inexpensive to implement and simple, yet reliable. The present invention achieves these goals.

SUMMARY OF THE INVENTION

An impact detector according to a first embodiment of the invention comprises first and second piezo film sheets arranged to define a bimorph, with at least the first sheet being defined by a plurality of positively and negatively poled segments, each for producing electrical signals of opposite polarity in response to impact thereon or changes in temperature thereof. The total area of the positively poled segments is substantially equal to the total area of the negatively poled segments so that a change in temperature will result in a signal output from the second sheet, but substantially no net signal output from the first sheet. Circuit means are provided for processing the signals.

An impact detector according to a second embodiment of the invention comprises first and second piezo film sheets arranged to define a bimorph, with the first and second sheets being separated by an intermediate layer of substantially thermally nonconductive material. The thermally nonconductive material interposes a delay to propagation of thermal energy from the first sheet to the second sheet so that both sheets produce a substantially simultaneous output in response to an impact, but the second sheet produces a delayed output relative to the first sheet in response to a change in temperature. Circuit means are provided for processing the signals.

An impact detector according to a third embodiment of the invention comprises first and second piezo film sheets arranged as an bimorph, with the second sheet being defined by a plurality of mechanically decoupled but electrically coupled fingers of piezo film. The first and second sheets each provide electrical signals of substantially equal magnitude in response to a substantially uniform change in temperature of the first and second sheets, but the magnitude of the signal produced by the first sheet in response to an impact is greater than the magnitude of the signal produced by the second sheet in response to an impact. Circuit means are provided for processing the signals.

An impact detector according to a fourth embodiment of the invention comprises first and second substantially coplanar piezo film sheets. The stretch direction of the first piezo film sheet is transverse to the stretch direction of second piezo film sheet, but the areas thereof are equal so that both piezo film sheets produce outputs of substantially equal magnitude in response to a substantially uniform change in temperature thereof, but produce outputs of differing magnitude in response to an impact.

BRIEF DESCRIPTION OF THE DRAWINGS

FIG. 9 illustrates a proposed piezo film bimorph arrangement for implementing the embodiments of FIGS. 3A and 3B, FIG. 4, and FIGS. 8A, 8B and 8C.

FIGS. 10 and 11 illustrate exemplary circuitry for processing the signals provided by the detectors of FIGS. 8A, 8B and 8C.

FIGS. 12A, 12B and 12C illustrate a variation of the embodiments of FIGS. 8A, 8B and 8C.

DETAILED DESCRIPTION OF THE PREFERRED EMBODIMENTS

Figure 1:
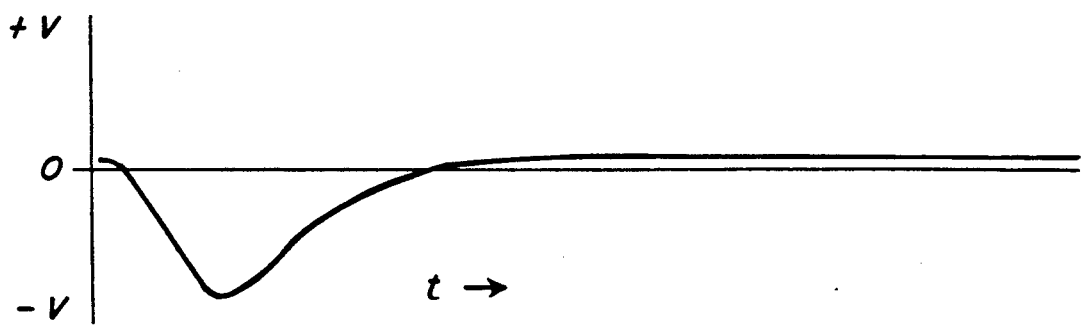
FIG. 1 illustrates the typical response of piezo film to a change in temperature (pyro effect).
Figure 2:
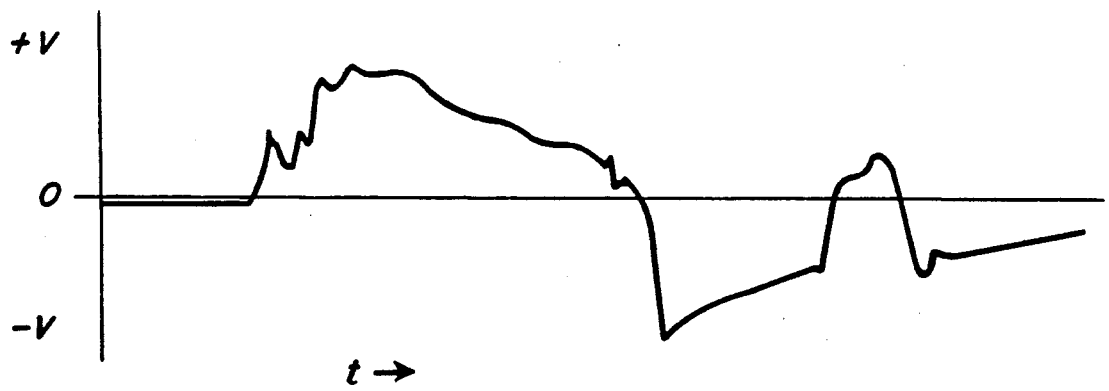
FIG. 2 illustrates the typical response of piezo film to an impact.

Referring to the drawings, wherein like numerals represent like elements, there are illustrated various embodiments of a pyroelectric compensated, piezoelectric impact detector. Each embodiment illustrated herein employs first and second piezo film sheets in a manner to be described. Except as may be expressly noted herein, each of the first and second piezo film sheets described herein is preferably 28 μm thick poled polyvinylidene fluoride (PVDF), such as Kynar ® brand piezo film manufactured by Atochem North America, Inc., Philadelphia, Pa. Unless otherwise specified, the PVDF is uniaxially or biaxially oriented or stretched. Additional information relating to the structure, properties and fabrication of Kynar ® piezo film may be found in the "Kynar ® Piezo Film Technical Film Manual" and in the "Kynar ® Piezo Film Product Summary and Price List", also available from Atochem North America. Both of these publications are incorporated herein by reference. Other materials which may be employed for the first and second piezo film sheets described herein include: a poled copolymer of polyvinylidene fluoride; a poled copolymer comprising polyvinylidene fluoride and at least one of trifluoroethylene, tetrofluoroethylene, hexafluorethylene, and vinylidene chloride; a poled polymer of polyvinylidene fluoride; and, a poled polymer of acrylonitrile.

Figure 3A:
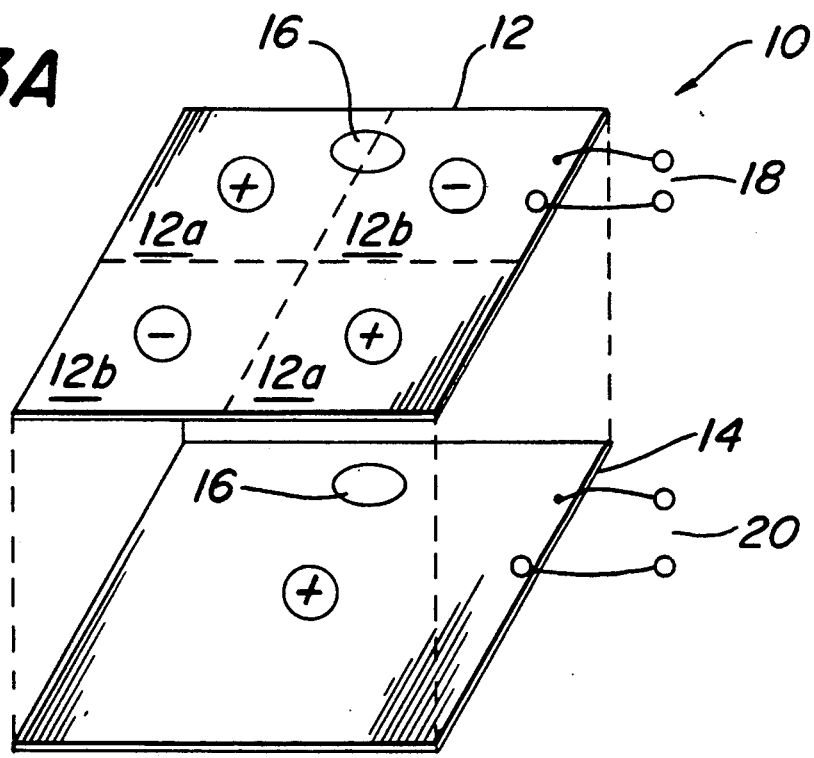
FIGS. 3A and 3B illustrate two variations of a first embodiment of a pyroelectric compensated, piezoelectric impact detector according to the present invention.
Figure 3B:
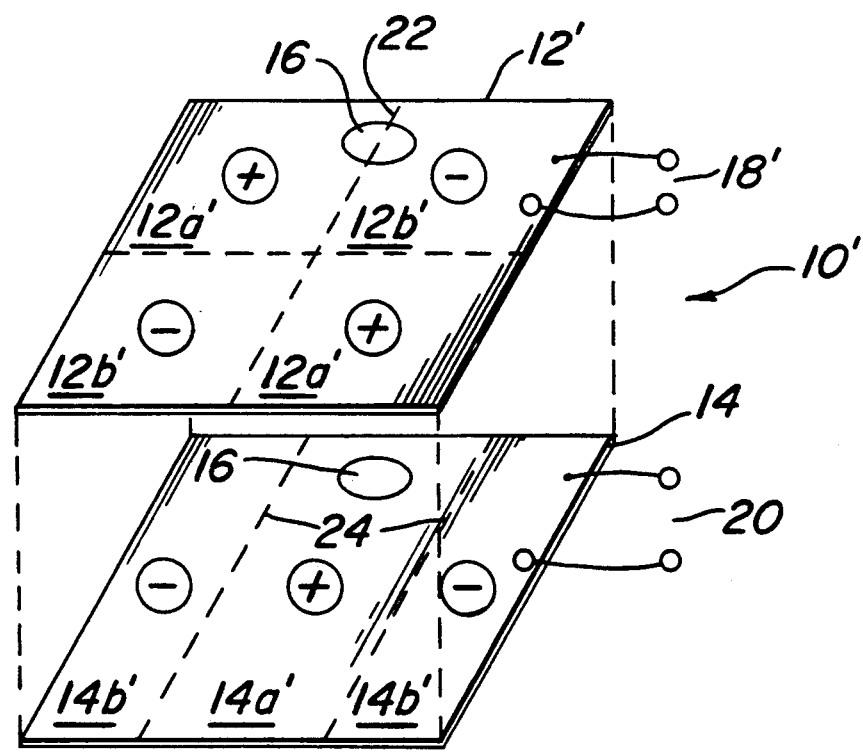

Referring now to FIGS. 3A and 3B, there is illustrated therein two variations of a first embodiment of a pyroelectric compensated, piezoelectric impact detector 10, 10' according to the present invention. The impact detectors of FIGS. 3A and 3B both comprise first and second piezo film sheets 12, 14 arranged as a bimorph, in well known fashion.

An exemplary bimorph construction is illustrated in FIG. 9. As shown therein, the top and bottom of each of the first and second piezo film sheets PF1 and PF2 are provided with a conductive coating or layer CL. The conductive layer may be applied by any well known procedure such as vacuum deposition, silk screening, or application of silver ink. An adhesive tape such as 3M brand 444 double sided tape manufactured by Minnesota Mining & Manufacturing Corp., St. Paul, Minn. may be provided between the first and second piezo film sheets PF1 and PF2 for affixing the two together. The underside of the bimorph may be provided with a foam layer F affixed to the bottom of the piezo film layer PF2. The foam layer F may comprise, for example, 1/32" open cell foam. The upper side of the bimorph may be provided with an additional conductor S for EMI shielding, as well as a Mylar ® cover C for protection. The orientation of the first and second piezo film sheets PF1 and PF2 in the bimorph of FIG. 9 is such that like poles face each other, i.e., the bottom of sheet PF1 and the top of sheet PF2 are of like polarity. Except as noted herein (e.g., FIGS. 3A and 3B where opposite poles face each other in certain areas of the opposing sheets), the bimorph construction of FIG. 9 is applicable to all bimorph embodiments of the invention described herein.

Referring again to FIG. 3A, it will be seen that the first piezo film sheet 12 (representing the top of detector 10) comprises a plurality of positively and negatively poled segments 12a, 12b, with oppositely poled segments alternating as shown. In other words, the oppositely poled segments 12a and 12b are arranged in a checkerboard fashion. The second piezo film sheet (representing the bottom of detector 10) is of single polarity, i.e., it is not segmented. Leads 18 and 20 are coupled to the top and bottom conductive layers of each sheet 12, 14 for conducting signals generated thereby to circuitry to be described hereinafter.

Importantly, the total area of all of the positively poled segments 12a should be substantially equal to the total area of all of the negatively poled segments 12b. It will therefore be appreciated that substantially uniform change of temperature at the first sheet 12 will result in production of substantially no net signal output thereof as a result of production of signals having opposite polarities that tend to cancel one another. It will also be appreciated that the occurrence of an impact 16 will cause both the first and second sheets 12, 14 to produce signals, and that the second sheet 14 will produce a signal when its temperature changes. Thus, it will be further appreciated that the near simultaneous occurrence of substantially no net signal output (e.g., zero volts) from the first sheet 12 and a nonzero signal output from the second sheet 14 is indicative that there has been a temperature change at the detector 10, but that there has been no impact 16 upon the detector 10. Similarly, it will be appreciated that the near simultaneous occurrence of a nonzero signal from both the first and second sheets 12, 14 is indicative of an impact upon the detector 10. Thus, the detector 10 of FIG. 3A provides output signals that can be employed to determine whether the production of signals is the result of an impact or a change in temperature.

Those skilled in the art will appreciate that the outputs from the first and second sheets 12, 14 will have substantially identical waveforms when the cause of the signal is an impact and when no temperature change occurred during the impact. On the other hand, those skilled in the art will appreciate that the output produced by the first sheet 12 will have a waveform that is substantially different from the waveform of the output produced by the second sheet 14 when the cause of the signal is the near simultaneous occurrence of an impact and a temperature change. Stated otherwise, it may be said that the signals from the first and second sheets are each characterized by an output waveform, and that the occurrence of an impact upon a portion of the detector, but not a change of temperature, causes production of signals having substantially identical waveforms from the first and second sheets 12,14. It may also be said that a substantial simultaneous occurrence of both an impact upon a portion of the detector 10 and a change in temperature thereof will cause production of signals having different waveforms.

Any suitable circuit means may be employed to process the signals produced by the first and second sheets 12, 14 so as to distinguish between a temperature change at the detector and an impact upon the detector. For example, a logic gate may be employed to receive the signals appearing on the leads 18, 20 and to provide a logic level output indicative of the phenomenon occurring at the detector. Thus, denominating the input signal appearing on lines 18 as "output 1" and the output signal appearing at lines 20 as "output 2", a logic gate may be employed to process the signals and provide an output as shown below:

| Output 1 | Output 2 | Logic Gate Output | Comment |
| --- | --- | --- | --- |
| zero | zero | zero | Nothing happened |
| zero | nonzero | zero | Temperature change only |
| nonzero | zero | zero | Not possible |
| nonzero | nonzero | nonzero | Impact has occurred |

Note that, with respect to the above table, when both output 1 and output 2 are nonzero, the possibility exists that both an impact has occurred and a change in temperature has occurred. In this event, if the waveform of output 1 is not identical to the waveform of output 2, then this is indicative that an impact and a temperature change have occurred simultaneously.

A problem with the detector 10 of FIG. 3A is that, if the force of an impact 16 is felt equally on two oppositely poled regions 12a, 12b, then the produced signals may cancel. The impact detector 10' of FIG. 3B overcomes this problem. The structure of the first sheet 12' of detector 10' is the same as described in connection with FIG. 3A, however, the structure of the second sheet 14' is somewhat different. In FIG. 3B, the second sheet 12' is defined by a plurality of positively and negatively poled segments 14a', 14b'. Importantly, no border separating any of the segments 12a', 12b' of the first sheet 12' should overlap any parallel border separating any of the segments 14a', 14b' of the second sheet 14'. Thus, it is important that parallel borders 22, 24 do not overlap. In this manner, an impact 16 occurring on border 22 of the first sheet 12' will miss border 24 on the second sheet 14'.

As in the case of sheets 12 and 12', the total area of all of the positively poled segments 14a' should be substantially equal to the total area of all of the negatively poled segments 14b' so that, when a uniform change in temperature of the second sheet 14' occurs, there will be a substantial net zero output from the second sheet 14' as a result of production charges that tend to cancel each other.

It will be appreciated that, as before, a logic gate may be employed to process the signals produced by the detector 10' of FIG. 3B and the logic gate output will be indicative of the phenomenon occurring at the detector 10'.

Figure 4:
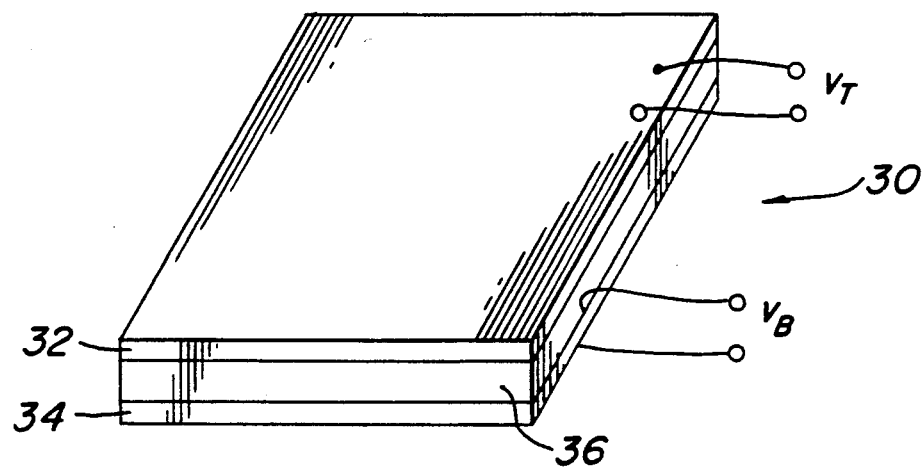
FIG. 4 illustrates a second embodiment of a pyroelectric compensated, piezoelectric impact detector according to the present invention.

FIG. 4 illustrates a second embodiment of pyroelectric compensated, piezoelectric impact detector according to the invention. As before, first and second piezo film sheets 32, 34 are arranged as a bimorph. However, unlike the bimorph described in connection with FIG. 9, the first and second sheets 32, 34 of FIG. 4 are separated by an intermediate layer 36 of a substantially thermally nonconductive material. The purpose of the substantially thermally nonconductive layer 36 is to interpose a delay to the propagation of thermal energy from the first sheet 32 to the second sheet 34 (i.e., from the top of the detector to the bottom of the detector). Any substantially thermally nonconductive material, such as a rubber sheet, may be employed for the intermediate layer 36.

The operation of the impact detector 30 of FIG. 4 is as follows. When an impact occurs upon a portion of the detector 30, both the first and second sheets will produce output signals substantially simultaneously as a result of the impact force being felt nearly simultaneously on both the first and second sheets 32, 34. But, in the absence of an impact, and in response to a change of temperature at the upper surface of the detector 30, the first sheet 32 will produce an output signal before the sheet 34 produces an output signal due to the thermal delay caused by the intermediate layer 36. The second sheet 34 will not produce any substantial output signal until thermal energy has propagated through intermediate layer 36. The top o first sheet 32 produces a voltage signal $V_T$ and the lower or second sheet 34 produces a voltage signal $V_B$. These signals are taken from the upper and lower conductive layers of each sheet 32, 34.

Thus, it will be appreciated, that for an impact, the magnitude of the output signal $V_T$ produced by the first sheet 32 will be approximately equal to the magnitude of the output signal $V_B$ produced by the second sheet 34. However, for a temperature change only (no impact), the magnitude of the output signal $V_T$ produced by the first sheet 32 will be greater than the magnitude of the output signal $V_B$ produced by the second sheet 34 until equilibrium has been reached.

Figure 5:
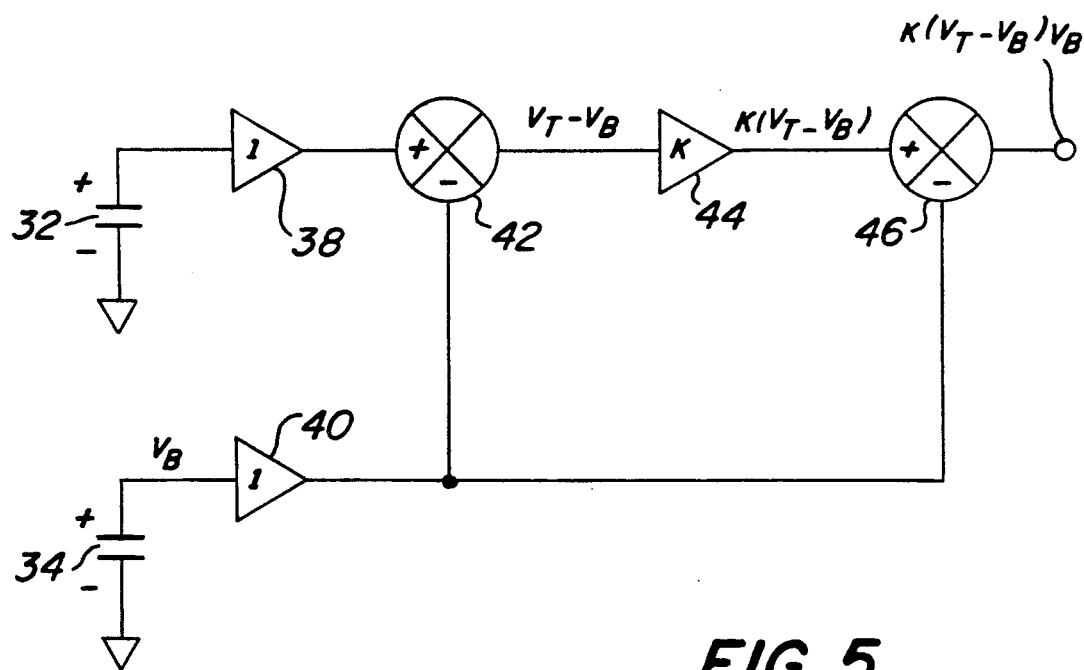
FIG. 5 illustrates exemplary circuitry for processing signals provided by the detector of FIG. 4.

FIG. 5 illustrates one embodiment of circuitry for processing the signals produced by the detector 30 of FIG. 4. The function of the circuitry of FIG. 5 is to receive the output signals produced by the first and second sheets 32, 34 and to provide an indication, based upon the signals, that an output from the detector 30 is due to an impact and not due to thermal energy. As shown, the circuitry of FIG. 5 comprises means 42 for summing the output signals produced by the first and second sheets 32, 34, and means 44 for multiplying the result thereof by a constant K having a value related to the thermal insulating character of the intermediate layer 36. In particular, the circuitry of FIG. 5 solves the equation: Output $= K (V_T - V_B) - V_B$. The means for solving this equation comprises unity gain amplifiers 38, 40 for buffering the signals $V_T$ and $V_B$ from the first and second sheets 32, 34. These signals are then passed to summing circuitry 42 which produces an output indicative of the result of $V_T - V_B$. This output is then amplified by amplifier 44 having gain K, whose output is indicative of the result of $K(V_T - V_B)$. A second summing circuit 46 receives this result as an input, and subtracts $V_B$ therefrom so as to solve the above equation.

It will therefore be appreciated that, in the case of an impact, $V_T$ will be approximately equal to $V_B$. In such case, irrespective of the value of K chosen for the gain of amplifier 44, the output of the circuit of FIG. 5 will always be a signal with a negative polarity and having a value of about $-V_B$. On the other hand, for a change of temperature only (no impact), the thermal insulating layer 36 may result in the value of $V_B$ as being 0.8 $V_T$ due to thermal attenuation (i.e., 20% attenuation). If the gain K of the amplifier 44 is selected to be 5, then the output of the circuit of FIG. 5 will be substantially zero. If the gain K of the amplifier is adjusted upwardly, the output of the circuit of FIG. 5 will be a signal having a positive polarity. Thus it will be seen that the value of K can be selected so that the output of the circuit of FIG. 5 will be substantially zero or of a first polarity when no impact has occurred on the detector 30 but a change in temperature has occurred, and is of a second, opposite polarity when an impact has occurred on the detector 30. Thus, the structure of the detector of 30, together with the circuit of FIG. 5, substantially eliminates any pyroelectric effects.

Figure 6A:
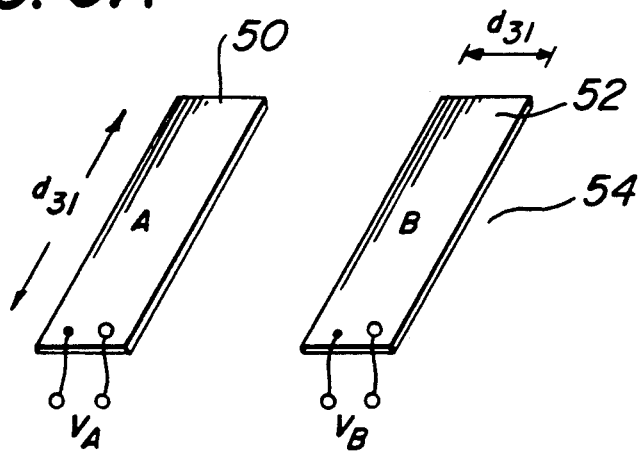
FIGS. 6A and 6B illustrate two variations of a pyroelectric compensated, piezoelectric impact detector according to a third embodiment of the present invention.
Figure 6B:
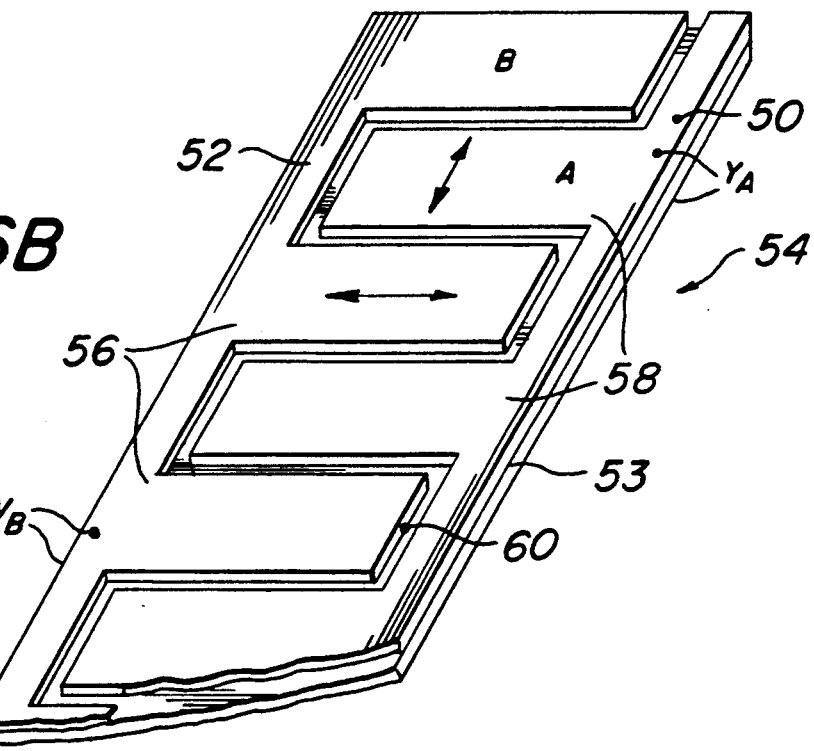

FIGS. 6A and 6B illustrate two variations of a third embodiment of a piezoelectric, pyroelectric compensated impact detector 54 according to the present invention. The embodiment of FIGS. 6A and 6B does not employ a bimorph arrangement, but rather employs coplanar first and second piezo film sheets 50, 52 arranged so that temperature changes will affect each sheet equally. In FIG. 6A, two piezo film sheets 50, 52 (in the form of two strips A, B) are shown arranged in side by side relationship, but plural strips of film 50, 52 arranged in an alternating arrangement (A, B, A, B, etc.) can be employed. In such case, sheets 50(strips A) should be electrically connected to each other and sheets 52 (strips B) should be electrically connected to each other. An alternative structure is shown in FIG. 6B wherein the sheets 50, 52 are each defined by plurality of fingers 56, 58, with the fingers 56, 58 of each sheet interdigitated as shown.

Figure 7:
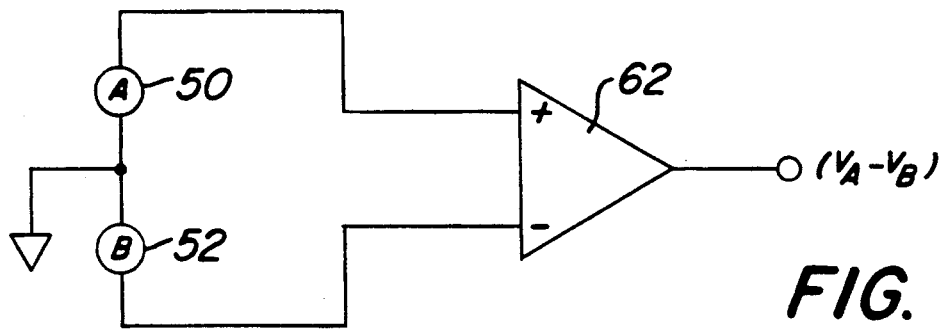
FIG. 7 illustrates exemplary circuitry for processing signals provided by the detectors of FIGS. 6A and 6B.

In the embodiment of FIGS. 6A and 6B, the two sheets 50,52 have substantially transverse uniaxial stretch directions. Importantly, the total area of the sheets 50, 52 (including the area of strips A and B or fingers 56, 58) should be substantially equal, and the pyroelectric coefficients of the sheets should be substantially equal. In this manner, pyroelectrically induced signals $V_A$ and $V_B$ will be substantially equal. However, as is known, the charge sensitivity of piezo film through the $d_{31}$ stretch direction is much greater than the charge sensitivity of piezo film through the transverse or $d_{32}$ stretch direction. Therefore in response to an impact, the piezo film sheets 50, 52 will produce signals of much different magnitude. Stated otherwise, the first and second sheets 50, 52 each provide electrical signals of substantially equal magnitude in response to a substantially uniform change in temperature of the first and second sheets 50, 52, but the magnitude of the electrical signal provided by the first sheet 50 in response to an impact is different than the magnitude of the electrical signal provided by the second sheet in response to an impact. As shown in FIG. 7, a differential input amplifier 62 may be employed to cancel out the pyroelectric effect, detect an impact, and provide an output signal accordingly.

In the embodiment of FIG. 6B, a space or gap 60 is preferably provided between the fingers 56, 58 as shown. The gap 60 should be small enough to insure that the two sheets 50, 52 remain at a uniform temperature. Moreover, as mentioned, the total surface area of sheets 50, 52 should be substantially equal. In addition, it is preferable, but not required, that the gap 60 be small enough to insure that larger impacts, i.e., footfalls, are felt by both sheets simultaneously. Preferably, both sides of the coplannar, piezo film sheets 50,52 are electrically common. The two sheets 50, 52 are mounted on a flexible layer 53, such as foam, that allows the fingers 56, 58 to move freely in all directions in response to an impact. The flexible layer 53 is secured to the two sheets 50, 52 with an adhesive such as double sided tape.

Figure 8A:
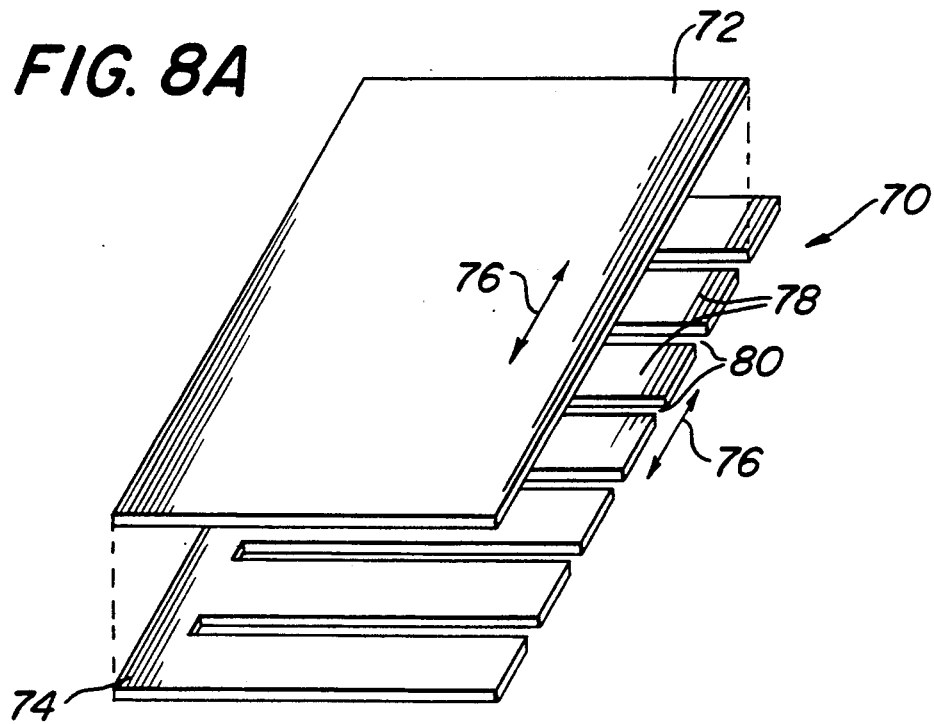
FIGS. 8A, 8B and 8C illustrate variations of a pyroelectric compensated, piezoelectric impact detector according to a fourth embodiment of the present invention.
Figures 8B, 8C:
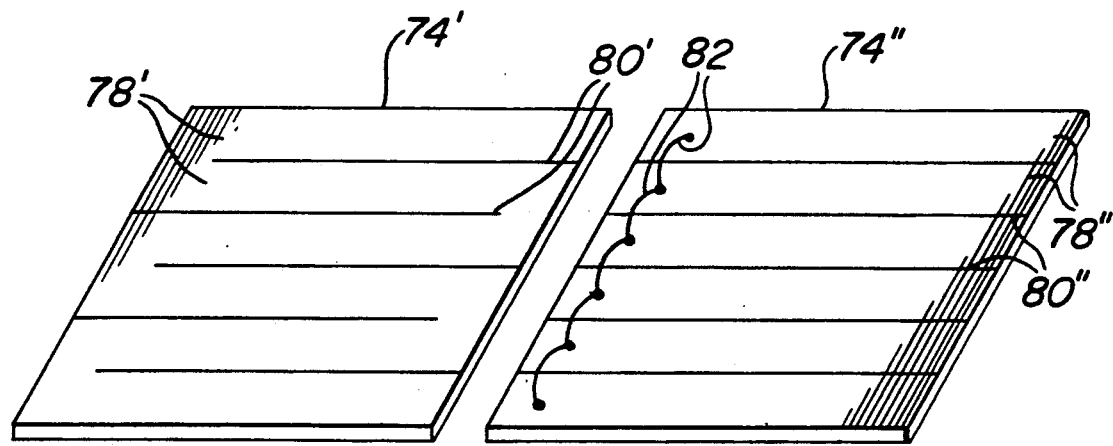

FIGS. 8A, 8B and 8C illustrate variations of a fourth embodiment of a piezoelectric pyroelectric compensated, impact detector 70 according to the invention. As before, the embodiments of FIGS. 8A, 8B and 8C employ first and second piezo film sheets 72,74, arranged as a bimorph as previously described. FIGS. 8A, 8B and 8C illustrate that the second sheet may take on various forms, as shown at 74, 74', 74". An important feature of the embodiments of FIGS. 8A–8C is that the second sheet 74, 74', 74" is defined by a plurality of fingers of piezo film. In the embodiment of FIG. 8A, the fingers 78 are defined by slits 80 at locations where piezo film has been cut away from the sheet 74. In the embodiment of FIG. 8B, fingers 78' are again defined by slits 80' at locations where piezo film has been cut away, but each successive slit originates on an opposite side of piezo film sheet 74' than the previous slit so that the resulting fingers 78' are essentially interdigitated. In the embodiment of FIG. C, each finger 78" is actually a separate strip of piezo film separated by a gap 80", but each strip is electrically connected to the next one by wires 82 bonded to the top and bottom metalized surfaces of the strips 78", as shown.

In each of the variations of FIGS. 8A, 8B and 8C, the slits or gaps 80, 80', 80" serve to mechanically decouple the fingers 78, 78', 78" from one another so that the effect of an impact is felt only by those fingers 78, 78', 78" which receive it. Thus, an impact upon detector 70 will cause both the first and second sheets 72, 74 to produce output signals. However, in response to an impact, the first sheet 72 will produce a signal of greater magnitude than the second sheet 74 as a result of the mechanical decoupling function performed by the slits or gaps 80, 80', 80".

The total area of piezo film of the first sheet 72 should be substantially equal to the total area of piezo film of the second sheet 74. In this manner, a substantially uniform change of temperature of the first and second sheets will result in those sheets producing output signals of substantially equal magnitude. It will thus be appreciated that, by providing appropriate processing circuitry (described below), these signals may be employed to distinguish an impact from a change in temperature.

In FIGS. 8A–8C the width of each finger 78, 78', 78" may be adjusted in order to maximize the impact detection sensitivity; the smaller the width, the greater the output voltage produced by the sheet 74, 74', 74" in response to an impact. Insofar as the width of the slits or gaps 80, 80', 80" is concerned, slits on the order of 1" have been found to produce acceptable results. However, if too much material is removed, this will have an adverse effect on the pyroelectric output of the sheet.

In FIG. 8A, the first sheet 72 is shown as being the top layer, and the second sheet 74 (the one defined by the plurality of fingers 78) is shown as being the bottom sheet. However, acceptable results have been observed when the second sheet 74 is employed as the top sheet and first sheet 72 is employed as the bottom sheet.

Preferably, as shown by the arrows 76, the sheets 72, 74 are uniaxially oriented, although the first sheet 72 may be bi-axially oriented. In any event, the second sheet 74 should be only uni-axially oriented. Thus, it will be observed that each of the fingers 78, 78', 78" extend in a direction transversely of the stretch direction of the film 74.

FIGS. 10 and 11 illustrate two different circuits for processing the signals provided by the detector 70 of FIGS. 8A, 8B and 8C. In the circuit of FIG. 10, the output of the first sheet 72 and the output of the second sheet 74 (or 74' or 74") are coupled together in parallel, opposing relationship, as shown, so that signals of substantially equal magnitude produce a resultant signal of substantially net zero magnitude at the input of amplifier 84, i.e., pyroelectric effects cancel each other. However, signals of substantially different magnitude will produce a resultant signal of substantially nonzero magnitude at the input of amplifier 84. In this case, the amplifier 84 will provide an output signal of substantially nonzero magnitude and such is indicative of an impact rather than a change in temperature, at detector.

In the circuit of FIG. 11, the signal from the first sheet 72 and the signal from the second sheet 74 (or 74' or 74") are each provided as separate inputs to a differential input amplifier 86 that detects whether the inputs are substantially different in magnitude. Thus, the amplifier 86 cancels pyroelectric effects and provides an output signal that indicates whether an impact has occurred.

A variant of the embodiment illustrated in FIGS. 8A–8C is illustrated in FIGS. 12A–12C. As illustrated in FIG. 12A, this embodiment is a bimorph having an upper piezo film layer 90 overlaying a lower piezo film layer 92 coupled together by an adhesive, such as double faced tape 94. As shown, the stretch directions 98, 100 of the two layers 90, 92 are substantially transverse to each other. As shown in FIGS. 12B and 12C, fingers 102 are defined by a plurality of vertical slits 96 that extend through both layers 90, 92 of the bimorph. The slits 96 through the upper and lower layers 90, 92 are substantially aligned by virtue of a preferred manufacturing process described below. In the embodiment of FIG. 12B, the slits 96 each originate from the same side of the layers 90, 92, as shown. In the embodiment of FIG. 12C, every other slit 96a originates from a different side of the layers 90, 92 than the intervening slits 96b, as shown. It will be seen that, in both embodiments, the slits are substantially perpendicular to the stretch direction of one of the layers, e.g., slits 96 are perpendicular to the stretch direction 98 of the upper layer 90. Similarly, in both embodiments, the slits are substantially parallel to the stretch direction of the other layer, e.g., slits 96 are parallel to the stretch direction 100 of the lower layer 92.

The bimorphs of FIGS. 12A–12C operate in much the same manner as described in connection with FIG. 6B, i.e., one layer is much more sensitive to impacts than the other layer, but the sensitivity of both layers to pyro effects is about the same. The fingers defined by the slits 96 serve much the same function as the fingers 78, 78' of FIGS. 8A–8C, i.e., mechanical decoupling. It has been found that, in the embodiments of FIGS. 12A–12C, the slits decrease the impact output of the layer having the stretch direction that is transverse to the slits (layer 90 in the illustration), and may enhance the impact output of the layer having the stretch direction that is parallel to the slits (layer 92 in the illustration). Circuitry such as a differential input operational amplifier may be employed to differentiate between impact signals and pyro effect signals.

One benefit of the embodiments of FIGS. 12A–12C over the embodiments of FIGS. 8A–8C is ease of manufacturing. The piezo film layers 90, 92 may first be assembled as a bimorph (FIG. 12A), then, subsequently, the slits 96 may be cut into the bimorph to arrive at the embodiment of either FIGS. 12B or 12C.

There have been described various embodiments of a piezoelectric, pyroelectric compensated, impact detector that has particular use in outdoor applications. The invention thus described may be embodied in other specific forms without departing from the spirit or essential attributes thereof and, accordingly, reference should be made to the appended claims, rather than to the foregoing specification, as indicating the true scope of the invention.

What is claimed is:

1. Impact detector comprising first and second piezo-film sheets arranged to define a bimorph, the first sheet being defined by a plurality N of positively and negatively poled segments each for producing electrical signals of opposite polarity in response to impact thereon or changes in temperature thereof, each segment having an area, the total area of the positively poled segments being substantially equal to the total area of the negatively poled segments, the magnitude of the signal produced by each segment as a result of a change in temperature being dependent upon the area of that segment, whereby substantially uniform changes in temperature of the first sheet result in substantially no net signal output thereof as a result of production of signals having opposite polarities that tend to cancel one another, the second sheet being of single polarity, whereby the second sheet produces a signal output when the temperature thereof changes.

2. Impact detector according to claim 1 wherein the substantially simultaneous occurrence of substantially no net signal output from the first sheet and a signal output from the second sheet is indicative that there has been a temperature change of the detector but no impact upon the impact upon the detector.

3. Impact detector according to claim 2 wherein the first and second sheets both produce a signal output in response to impact upon a portion of the detector, and wherein substantial simultaneous occurrence of a signal from both the first and second sheets is indicative of an impact upon the detector.

4. Impact detector according to claim 3 wherein the signals from the first and second sheets are each characterized by an output waveform, and wherein the occurrence of an impact upon a portion of the detector but not a change in temperature thereof causes production of signals having substantially identical waveforms from the first and second sheets, and wherein the substantial simultaneous occurrence of both an impact upon a portion of the detector and a change in temperature thereof causes production of signals having different waveforms.

5. Impact detector according to claim 3 further comprising circuit means coupled to receive the signals produced by the first and second sheets for distinguishing between a temperature change at the detector and an impact upon the detector and providing an output signal indicative thereof.

6. Impact detector according to claim 5 wherein the circuit means comprises a logic gate.

7. Impact detector according to claim 1 wherein the first and second sheets are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

8. Impact detector comprising first and second piezofilm sheets arranged to define a bimorph, the first and second sheets each being defined by pluralities N and M, respectively, of positively and negatively poled segments each for producing electrical signals of opposite polarity in response to impact thereon or changes in temperature thereof, each segment having an area, the total area of the positively poled segments in each sheet being substantially equal to the total area of the negatively poled segments in that sheet, and wherein the segments of the first and second sheets define parallel lines of demarcation on each sheet and wherein there is no substantial parallel overlap of the parallel lines of demarcation of the first sheet and those of the second sheet.

9. Impact detector comprising:
a) first and second piezo film sheets arranged to define a bimorph, the first and second sheets being separated by an intermediate layer of substantially thermally nonconductive material for interposing a delay to propagation of thermal energy from the first sheet to the second sheet, both the first and second sheets producing output signals substantially simultaneously in response to an impact upon the detector, but, in the absence of an impact and in response to a change of temperature at the detector, the first sheet producing an output signal and the second sheet providing no substantial output signal until thermal energy has propagated through the intermediate layer to the second sheet wherein production of any signal by the second sheet is delayed with respect to production of an output signal by the first sheet; and,
b) circuit means coupled to receive output signals produced by the first and second sheets for providing an indication, based upon the signals, that an output from the detector is due to an impact and not to thermal energy, the circuit means comprising means for summing the output signals produced by the first and second sheets and for multiplying the result thereof by a constant having a value related to a characteristic of the intermediate layer.

10. Impact detector according to claim 9 wherein the characteristic is a thermal insulation characteristic of the intermediate layer.

11. Impact detector according to claim 10 wherein the circuit means comprises means for solving the equation:

$$K(V_1-V_2)V_2$$

where:
K is a constant having a value related to the characteristic of the intermediate layer;
$V_1$ is the magnitude of the signal produced by the first sheet; and,
$V_2$ is the magnitude of the signal produced by the second sheet;
the circuit means providing an output in accordance with the result of the equation, the output of the circuit means being the indication.

12. Impact detector according to claim 11 wherein the circuit means comprises:
(i) first summing means for forming the sum $V_1-V_2$;
(ii) amplifier means for amplifying the sum $V_1-V_2$ by gain K and thereby and producing the product $K(V_1-V_2)$; and
(iii) second summing means for forming the sum $K(V_1-V_2)-V_2$, the output of the circuit means being the sum of the second summing means;
the value of K being selected so that the output of the circuit means is substantially zero or of a first polarity when no impact has occurred on the detector but a change in temperature has occurred at the detector, and is of a second, opposite polarity when an impact has occurred on the detector.

13. Impact detector according to claim 9 wherein the first and second sheets are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

14. Impact detector comprising a piezo film bimorph having first and second piezo film layers, the second layer being defined by a plurality of mechanically decoupled but electrically coupled fingers of piezo film, the overall area of piezo film of the first and second layers being substantially equal, the first and second layers providing electrical signals of substantially equal magnitude in response to a substantially uniform change in temperature of the first and second layers, the first and second layers providing electrical signals in response to an impact upon a portion of the detector but the magnitude of the electrical signal provided by the first layer in response to an impact being greater than the magnitude of the electrical signal provided by the second layer in response to an impact.

15. Impact detector according to claim 14 further comprising a flexible layer disposed beneath the first and second layers.

16. Impact detector according to claim 14 wherein the fingers are physically separate.

17. Impact detector according to claim 14 wherein the first layer is a top layer and the second layer is a bottom layer.

18. Impact detector according to claim 14 wherein the first layer is a bottom layer and the second layer is a top layer.

19. Impact detector according to claim 14 wherein the first and second layers each comprise a sheet of piezo film and the fingers are defined by a plurality slits in the second layer sheet.

20. Impact detector according to claim 19 wherein the piezo film sheets each have stretch direction, the slits in the second layer sheet extending transversely of the stretch direction.

21. Impact detector according to claim 14 wherein the first and second layers each have a stretch direction, and the fingers extend in a direction transversely of the stretch direction.

22. Impact detector according to claim 14 wherein the first layer comprises a sheet of bi-axially oriented piezo film, and the second layer comprises a sheet of uni-axially oriented piezo film.

23. Impact detector according to claim 14 further comprising circuit means coupled to receive as inputs the signals produced by the first and second layers for providing an output signal indicative that electrical signals from the first and second layers are the result of an impact and not the result of a change in temperature at the detector.

24. Impact detector according to claim of 23 Wherein the circuit means detects whether the inputs are substantially different in magnitude.

25. Impact detector according to claim 24 wherein the circuit means comprises a differential input amplifier.

26. Impact detector according to claim 14 wherein the signals produced by the first and second layers are combined in parallel opposing relationship so that signals of substantially equal magnitude produce an output signal of substantially net zero magnitude and signals of substantially different magnitude produce an output signal of substantially non-zero magnitude, an output signal of substantially non-zero magnitude being indicative that signals from the first and second layers are the result of an impact and not the result of a change in temperature at the detector.

27. Impact detector according to claim 14 further comprising means for shielding the bimorph from EMI.

28. Impact detector according to claim 14 wherein the first and second layers are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

29. Impact detector comprising first and second coplanar piezo film sheets, the overall area of piezo film of the first and second sheets being substantially equal, both sheets having a stretch direction, the stretch direction of the first sheet being substantially transverse to the stretch direction of the second sheet, the first and second sheets providing electrical signals of substantially equal magnitude in response to a substantially uniform change in temperature of the first and second sheets, the first and second sheets providing electrical signals in response to an impact upon a portion of the detector but the magnitude of the electrical signal provided by the first sheet in response to an impact being greater than the magnitude of the electrical signal provided by the second sheet in response to an impact.

30. Impact detector according to claim 29 wherein each sheet is defined by a plurality of fingers, the fingers of the first and second sheets being interdigitated.

31. Impact detector according to claim 30 further comprising a flexible layer disposed beneath the first and second sheets for permitting the fingers to move substantially freely in all directions in response to an impact.

32. Impact detector according to claim 29 further comprising circuit means coupled to receive as inputs the signals produced by the first and second sheets for providing an output signal indicative that electrical signals from the first and second sheets are the result of an impact and not the result of a change in temperature at the detector.

33. Impact detector according to claim of 32 wherein the circuit means detects whether the inputs are substantially different in magnitude.

34. Impact detector according to claim 33 wherein the circuit means comprises a differential input amplifier.

35. Impact detector according to claim 29 wherein the first and second sheets are arranged in substantial side by side relationship.

36. Impact detector according to claim 29 wherein the first and second sheets are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

37. Pyroelectric compensated impact detector comprising first and second piezofilm sheets arranged to define a bimorph, the first sheet being defined by a plurality N of positively and negatively poled segments each for producing electrical signals of opposite polarity in response to impact thereon or changes in temperature thereof, each segment having an area, the total area of the positively poled segments being substantially equal to the total area of the negatively poled segments, the magnitude of the signal produced by each segment as a result of a change in temperature being dependent upon the area of that segment, the second sheet being of single polarity;

wherein substantially uniform changes in temperature of the first sheet results in substantially no net signal output thereof as a result of production of signals having opposite polarities that tend to cancel one another, and the second sheet produces a signal output when the temperature thereof changes, the substantially simultaneous occurrence of substantially no net signal output from the first sheet an a signal output from the second sheet being indicative that there has been a temperature change of the detector but no impact upon the impact upon the detector, and, wherein the first and second sheets both produce a signal output in response to impact upon a portion of the detector, and the substantial simultaneous occurrence of a signal from both the first and second sheets is indicative of an impact upon the detector.

38. Impact detector according to claim 37 wherein the signals from the first and second sheets are each characterized by an output waveform, and wherein the occurrence of an impact upon a portion of the detector but not a change in temperature thereof causes production of signals having substantially identical waveforms from the first and second sheets, and wherein the substantial simultaneous occurrence of both an impact upon a portion of the detector and a change in temperature thereof causes production of signals having different waveforms, the impact detector further comprising a logic gate coupled to receive the signals produced by the first and second sheets for providing an output signal indicative of whether only an impact and not a change in temperature has occurred.

39. Pyroelectric compensated impact detector according to claim 37 wherein the first and second sheets are each one of: poled polyvinylidene fluoride: a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

40. Pyroelectric compensated impact detector comprising:
a) first and second piezo film sheets arranged to define a bimorph, the first and second sheets being separated by an intermediate layer of substantially thermally nonconductive material for interposing a delay to propagation of thermal energy from the first sheet to the second sheet, both the first and second sheets producing output signals substantially simultaneously in response to an impact upon the detector, but, in the absence of an impact and in response to a change of temperature at the detector, the first sheet producing an output signal and the second sheet providing no substantial output signal until thermal energy has propagated through the intermediate layer to the second sheet wherein production of any signal by the second sheet being delayed with respect to production of an output signal by the first sheet; and, b) circuit means coupled to receive output signals produced by the first and second sheets for summing the output signals produced by the first and second sheets and for multiplying the result thereof by a constant having a value related to thermal insulation characteristic of the intermediate layer, the circuit means providing an indication that an output from the detector is due to an impact and not to thermal energy.

41. Pyroelectric compensated impact detector according to claim 40 wherein the circuit means comprises means for solving the equation:

$$K(V_1-V_2)-V_2$$

where:
K is a constant having a value related to a thermal insulation characteristic of the intermediate layer;
$V_1$ is the magnitude of the signal produced by the first sheet; and,
$V_2$ is the magnitude of the signal produced by the second sheet;
the circuit means providing an output in accordance with the result of the equation, the output of the circuit means being the indication, the value of K being selected so that the output of the circuit means is substantially zero or of a first polarity when no impact has occurred on the detector but a change in temperature has occurred at the detector, and is of a second, opposite polarity when an impact has occurred on the detector.

42. Pyroelectric compensated impact detector according to claim 40 wherein the first and second sheets are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

43. Pyroelectric compensated impact detector comprising:

a) a piezo film bimorph having first and second piezo film layers, the second layer being defined by a plurality of mechanically decoupled but electrically coupled fingers of piezo film, the second layer having a uniaxial stretch direction, the fingers extending in a direction substantially transversely of the stretch direction, the overall area of piezo film of the first and second layers being substantially equal, the first and second layers providing electrical signals of substantially equal magnitude in response to a substantially uniform change in temperature of the first and second layers, the first and second layers providing electrical signals in response to an impact upon a portion of the detector but the magnitude of the electrical signal provided by the first layer in response to an impact being greater than the magnitude of the electrical signal provided by the second layer in response to an impact; and, b) circuit means for receiving the signals produced by the first and second layers for providing an output signal indicative that electrical signals from the first and second layers are the result of an impact and not the result of a change in temperature at the detector.

44. Impact detector according to claim 43 further comprising a flexible layer disposed beneath the first and second layers.

45. Pyroelectric compensated impact detector according to claim of 43 wherein the circuit means is a differential input amplifier receiving as separate inputs the signals produced by the first and second layers for detecting whether the inputs are substantially different in magnitude.

46. Pyroelectric compensated impact detector according to claim 43 wherein the signals produced by the first and second layers are combined in parallel opposing relationship so that signals of substantially equal magnitude produce a resultant signal of substantially net zero magnitude and signals of substantially different magnitude produce a resultant signal of substantially non-zero magnitude, a resultant signal of substantially non-zero magnitude being indicative that signals from the first and second layers are the result of an impact and not the result of a change in temperature at the detector, the circuit means comprising an amplifier for receiving and buffering the resultant signal.

47. Pyroelectric compensated impact detector according to claim 43 wherein the first layer comprises a sheet of one of uni-axially or biaxially stretched piezo film.

48. Pyroelectric compensated impact detector according to claim 43 wherein the first and second layers are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

49. Pyroelectric compensated impact detector comprising:

a) first and second coplanar piezo film sheets, the overall area of piezo film of the first and second sheets being substantially equal, both sheets having a stretch direction, the stretch direction of the first sheet being substantially transverse to the stretch direction of the second sheet, the first and second sheets providing electrical signals of substantially equal magnitude in response to a substantially uniform change in temperature of the first and second sheets, the first and second sheets providing electrical signals in response to an impact upon a portion of the detector but the magnitude of the electrical signal provided by the first sheet in response to an impact being greater than the magnitude of the electrical signal provided by the second sheet in response to an impact; and, b) circuit means coupled to receive as inputs the signals produced by the first and second sheets for detecting whether the inputs are substantially different in magnitude and for providing an output signal indicative that electrical signals from the first and second layers are the result of an impact and not the result of a change in temperature at the detector.

50. Pyroelectric compensated impact detector according to claim 49 wherein each sheet is defined by a plurality of fingers and the fingers of each sheet are interdigitated.

51. Impact detector according to claim 50 further comprising a flexible layer disposed beneath the first and second sheets for permitting the fingers to move substantially freely in all directions in response to an impact.

52. Impact detector according to claim 49 wherein the first and second sheets are arranged in substantial side by side relationship.

53. Pyroelectric compensated impact detector according to claim 49 wherein the first and second sheets are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

54. Impact detector comprising first and second piezo film sheets, the first sheet overlaying the second sheet and the two sheets being affixed to each other by an adhesive to define a bimorph, the bimorph comprising a plurality of fingers, the overall area of the piezo film of the first and second sheets being substantially equal, both sheets having a stretch direction, the stretch direction of the first sheet being substantially transverse to the stretch direction of the second sheet, the first and second sheets providing electrical signals of substantially equal magnitude in response to a substantially uniform change in temperature of the first and second sheets, the first and second sheets providing electrical signals in response to an impact upon a portion of the detector but the magnitude of the electrical signal provided by the first sheet in response to an impact being greater than the magnitude of the electrical signal provided by the second sheet in response to an impact.

55. Impact detector according to claim 54 wherein the first and second sheets are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

56. Impact detector according to claim 54 further comprising a flexible layer disposed beneath the first and second sheets for permitting the fingers to move substantially freely in all directions in response to an impact.

57. Impact detector according to claim 54 wherein the fingers are defined by a plurality of substantially aligned slits extending through both the first and second sheets, the slits being substantially perpendicular to the stretch direction of one of the first and second sheets.

58. Impact detector according to claim 57 wherein every other slit originates from a different side of the first and second sheets than intervening slits.

59. Impact detector according to claim 57 wherein each slit originates from the same side of the first and second sheets.

60. Pyroelectric compensated impact detector comprising:

(a) first and second piezo film sheets, the first sheet overlaying the second sheet and the two sheets being affixed to each other by an adhesive to define a bimorph, the bimorph comprising a plurality of fingers defined by a plurality of substantially aligned slits extending through both the first and second sheets, the overall area of piezo film of the first and second sheets being substantially equal, both sheets having a stretch direction, the stretch direction of the first sheet being substantially traverse to the stretch direction of the second sheet, the slits being substantially perpendicular to the stretch direction of one of the first and second sheets, the first and second sheets providing electrical signals of substantially equal magnitude in response to a substantially uniform change in temperature of the first and second sheets, the first and second sheets providing electrical signals in response to an impact upon a portion of the detector but the magnitude of the electrical signal provided by the first sheet in response to an impact being greater than the magnitude of the electrical signal provided by the second sheet in response to an impact; and, (b) circuit means coupled to receive as inputs the signals produced by the first and second sheets for detecting whether the inputs are substantially different in magnitude and for providing an output signal indicative that electrical signals from the first and second layers are the result of an impact and not the result of a change in temperature at the detector.

61. Impact detector according to claim 60 wherein the first and second sheets are each one of: poled polyvinylidene fluoride; a poled copolymer of vinylidene fluoride; a poled copolymer comprising vinylidene fluoride and at least one of trifluoroethylene, tetrafluoroethylene, hexafluoroethylene, and vinylidene chloride; a poled polymer of polyvinylchloride; a poled polymer of acrylonitrile.

62. Impact detector according to claim 60 further comprising a flexible layer disposed beneath the first and second sheets for permitting the fingers to move substantially freely in all directions in response to an impact.

* * * * *